United States Patent [19]
Tokura et al.

[11] Patent Number: 5,365,085
[45] Date of Patent: Nov. 15, 1994

[54] POWER SEMICONDUCTOR DEVICE WITH A CURRENT DETECTING FUNCTION

[75] Inventors: Norihito Tokura, Okazaki; Tsuyoshi Yamamoto, Kariya, both of Japan

[73] Assignee: Nippondenso Co., Ltd., Kariya, Japan

[21] Appl. No.: 735,512

[22] Filed: Jul. 29, 1991

[30] Foreign Application Priority Data

Jul. 30, 1990 [JP] Japan .................................. 2-202229
Jul. 19, 1991 [JP] Japan .................................. 3-179654

[51] Int. Cl.$^5$ .................. H01L 29/74; H01L 31/111; H01L 29/00; H01L 27/082
[52] U.S. Cl. ........................... 257/139; 257/154; 257/528; 257/578
[58] Field of Search ............... 257/139, 154, 528, 578

[56] References Cited

U.S. PATENT DOCUMENTS

| | | | |
|---|---|---|---|
| 4,072,975 | 2/1978 | Ishitani | 257/139 |
| 4,402,003 | 8/1983 | Blanchard | 257/139 |
| 4,605,948 | 8/1986 | Martinelli | 257/139 |
| 4,612,449 | 9/1986 | Patalong | 257/139 |
| 4,630,084 | 12/1986 | Tihanyi | 257/139 |
| 4,691,223 | 9/1987 | Murakami et al. | 257/565 |
| 4,783,690 | 11/1988 | Walden et al. | 257/139 |
| 4,962,411 | 10/1990 | Tokura et al. | 257/139 |

FOREIGN PATENT DOCUMENTS

| | | |
|---|---|---|
| 3200634 | 7/1983 | Germany . |
| 63-12175 | 1/1981 | Japan . |
| 57-141965 | 9/1982 | Japan . |
| 58-42275 | 3/1983 | Japan . |
| 61-296770 | 12/1986 | Japan . |
| 2138773 | 5/1990 | Japan . |

Primary Examiner—William Mintel
Assistant Examiner—Wael Fahmy
Attorney, Agent, or Firm—Cushman, Darby & Cushman

[57] ABSTRACT

A power semiconductor device constituted of a MOSFET incorporating a current detecting function for detecting current making use of a voltage drop developed across a channel resistance in which variations in the channel resistance due to its temperature and the gate voltage are compensated for and thereby highly accurate current detection is achieved.

24 Claims, 10 Drawing Sheets

POWER SEMICONDUCTOR DEVICE WITH A CURRENT DETECTING FUNCTION

BACKGROUND OF THE INVENTION

1. Field of the Invention

The present invention relates to a power semiconductor device having a current detecting function to detect the current flowing therethrough.

2. Description of the Related Arts

The power semiconductor device is that designed to provide power levels of current such as to drive a motor. There is a need to detect the current flowing through the power semiconductor device for two fundamental objects: first, to detect whether or not a load such as a motor is driven at a predetermined power level; second, to detect an overcurrent at the time of overload to thereby prevent the load and the power semiconductor device from being damaged.

Various current detecting systems have so far been proposed to achieve the above described objects. Among them, there is a power semiconductor device with a current detecting function disclosed in Japanese Laid-open Patent Publication No. 63-12175 as a highly sensitive current detecting system which does not producing no additional power loss even if the current detecting function is added to the power semiconductor device. The structure of such semiconductor device will be described below with reference to FIG. 6 showing its configuration.

Broadly speaking, the semiconductor device in FIG. 6 is formed of a current signal detecting portion 22 and a plurality of unit cells of n-channel vertical MOSFET constituting a power control portion, and the unit cell of a portion of the power control portion adjoining the current signal detecting portion 22 constitute a current signal generating portion 21.

First, with regard to the structure of the power control portion, an $n^-$-type drain layer 2 is formed on the surface of an $n^+$-type substrate 1, a gate oxide film 3 is formed on the drain lasher 2 by oxidizing the surface of the drain layer 2, and a gate electrode 4 is formed on the gate oxide film patterned into a predetermined shape. By setting tap the width 11 of the gate electrode 4 using the gate electrode 4 as a mask, p-type base regions 7a are formed by diffusion in the surface of the drain layer 2 in predetermined regions at predetermined intervals, and $n^+$-type source regions 8a are formed by diffusion in the p-type base regions 7a.

A portion near the surface of the p-type base region 7a where the $n^+$-type source region 8a is not formed becomes a channel 9a. The gate electrode 4 is covered by an interlayer insulating film 5. A source electrode 6a is formed in ohmic contact with the surface of the $n^+$-type source region 8a and the p-type base region 7a. A drain electrode 10 is formed in ohmic contact with the reverse of the $n^+$-type substrate 1 and the drain electrode 10 is connected with a drain terminal D. The source electrode 6a is connected with a source electrode S and the gate electrode 4 is connected with a gate electrode G.

Then, with regard to the structure of the current signal detecting portion 22, the width 12 of the gate electrode 4 is set up using, as a mask, the gate electrode 4 patterned into a predetermined shape, and thereby, a p-type shield region 7b is formed by diffusion in the surface of the $n^-$-type drain layer 2 in a region a predetermined distance apart from the channel 9a, and $n^+$-type probe regions 8b are formed by diffusion in the p-type sealed region 7b. A portion near the surface of the p-type shield region 7b where the $n^+$-type probe region 8b is not formed becomes a channel 9b.

The surface of the p-type shield region 7b is in ohmic contact with the source electrode 6a. The probe region 8b is in ohmic contact with a probe electrode 6b, which in turn is in connection with a probe terminal P.

The principle of current detection in the semiconductor device with a current detecting function shown in FIG. 6 is such that utilizes the channel resistance of the vertical MOSFET of a double diffusion type as current detecting means. Referring to FIG. 6, the path of the flow of electrons as carriers flowing through the device goes, as indicated by the path 30, by way of the source terminal S → source electrode 6a → source region 8a → channel 9a → $n^-$-type drain layer 2 → $n^+$-type substrate 1 → drain electrode 10 → drain terminal D.

The path for detecting the voltage drop developed across the channel resistance of the channel 9a goes, as shown by the path 31, by way of the accumulation region 11 → channel 9b → $n^+$-type probe region 8b → probe electrode 6b → probe terminal P, and the voltage drop across the channel resistance of the channel 9a is output between the probe terminal P and the source terminal S. Since the $n^+$-type probe region 8b is electrically shielded by the p-type shield region 7b from the regions such as the $n^-$-type drain layer 2 where voltage and current greatly change, there is a merit that current detection with less noise and higher S/N ratio can be achieved at the probe terminal P.

However, the conventional art utilizing the channel resistance as the current detection means as shown in FIG. 6 has the following points of problem:

(1) since the channel resistance varies with temperature, it is difficult to perform the current detection with high accuracy; and (2) since the channel resistance varies according to the gate voltage, it is difficult to perform the current detection with high accuracy under the condition of inconstant gate voltage.

SUMMARY OF THE INVENTION

The present invention was made in view of the above described points of problem. Accordingly, an object of the present invention is to provide a power semiconductor device capable of current detection with high accuracy by means of a compensation resistor portion provided within the power semiconductor device, which, even if the temperature or gate voltage is changed, compensates for the effects of such changes.

In order to achieve the above mentioned object, the power semiconductor device according to the present invention is arranged by providing a power semiconductor device of an insulated gate-type including a current detecting portion, in which the channel resistance of the channel portion of the unit cell of the power control portion, made up of a plurality of unit cells connected in parallel, is designed to serve as the means for detecting the current flowing through the power control portion, with a compensation resistor portion, which includes a channel portion of an insulated gate type lateral transistor structure adapted such that the resistance of the compensation resistor portion and the channel resistance of the channel portion of the unit cell of the power control portion are well symmetrical in their electric characteristics.

By the above described arrangement, it becomes possible to compensate for the current detection error made in the current detecting portion even if there are produced changes in the temperature or gate voltage and an excellent effect can be obtained that current detection is achieved with high accuracy.

DETAILED DESCRIPTION OF THE EMBODIMENTS

The present invention will be described below as related to its embodiments shown in the accompanying drawings.

First Embodiment

Figure 1:
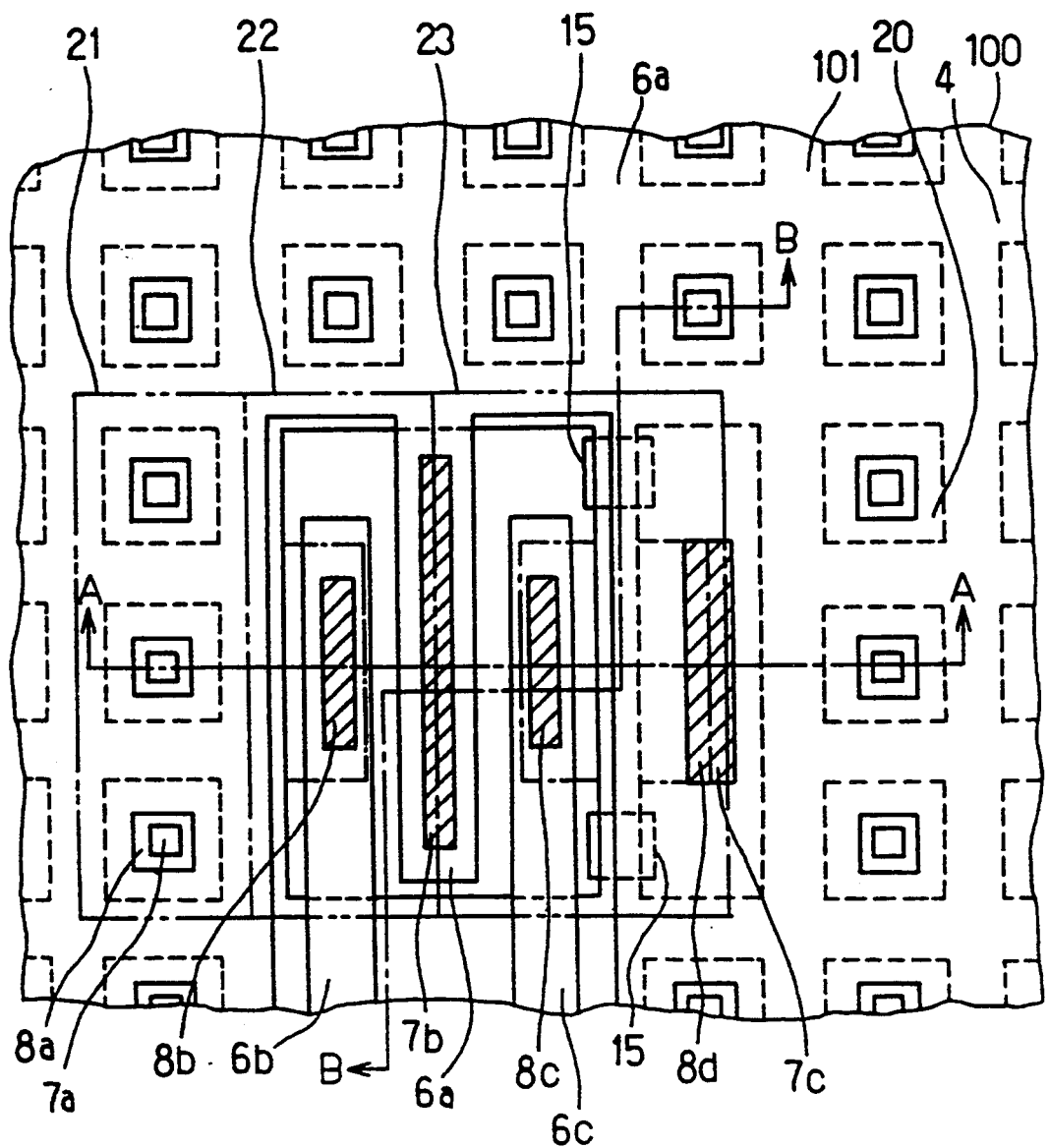
FIG. 1 is a plan view of n-channel vertical MOSFET showing a first preferred embodiment of a power semiconductor device according to the present invention.
Figure 2A:
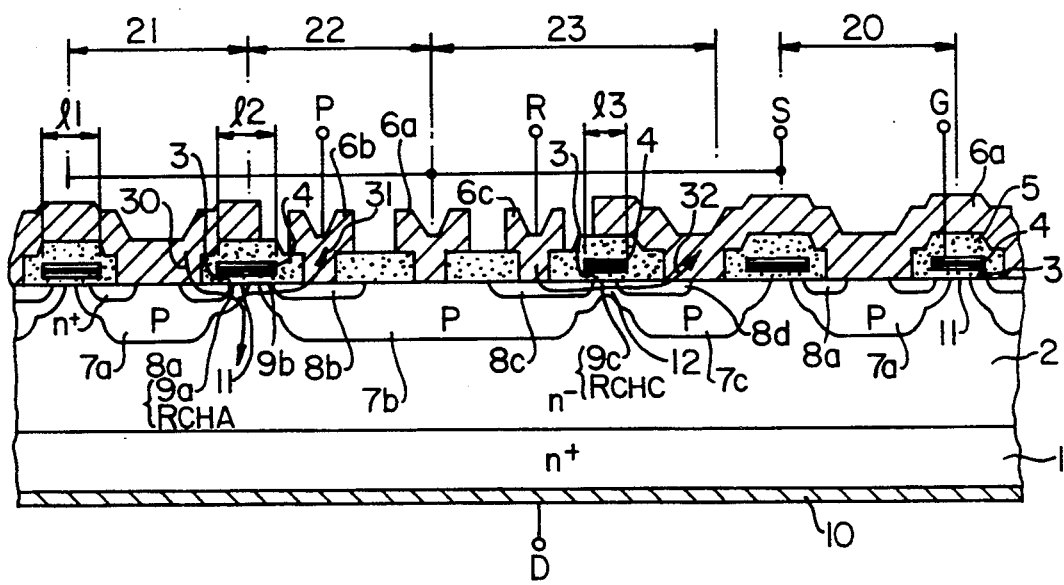
FIG. 2A is a sectional view taken along line A—A of FIG. 1
Figure 2B:
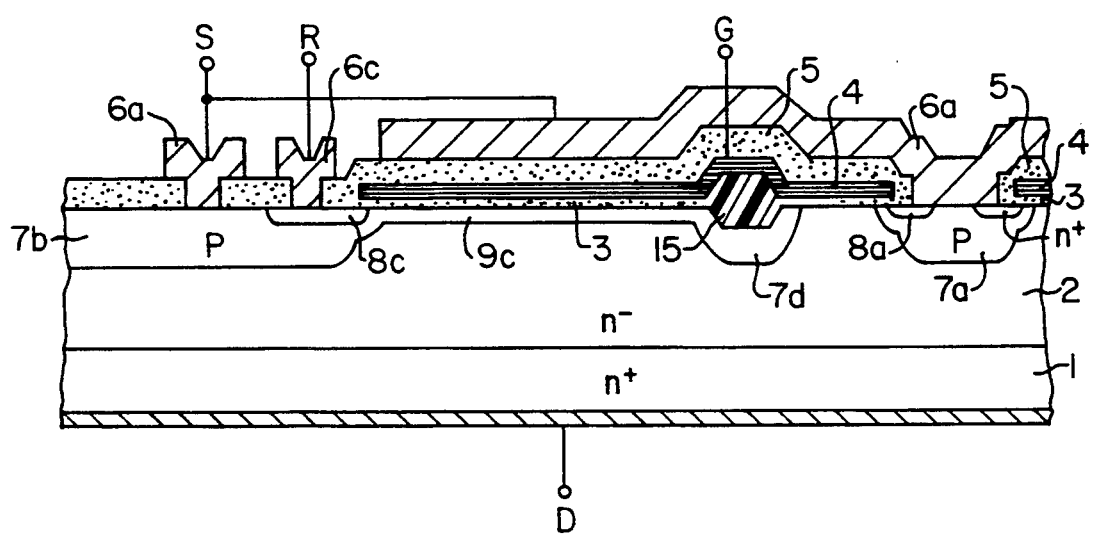
FIG. 2B is a sectional view taken along line B—B of FIG. 1.

FIG. 1 and FIG. 2 are for showing a first embodiment of the present invention applied to n-channel vertical MOSFET, in which FIG. 1 is a plan view FIG. 2A is a sectional view taken along line A—A of FIG. 1 and FIG. 2B is a sectional view taken along line B—B of FIG. 1.

Broadly speaking, a power semiconductor device 100 is formed of a power control portion 101 constituted of a plurality of unit cells 20 of n-channel vertical MOSFET, a current signal generating portion 21 made up of a portion of the unit cells of the power control portion 101, a current signal detecting portion 22, and a compensation resistor portion 23 of lateral MOSFET.

Figure 6:
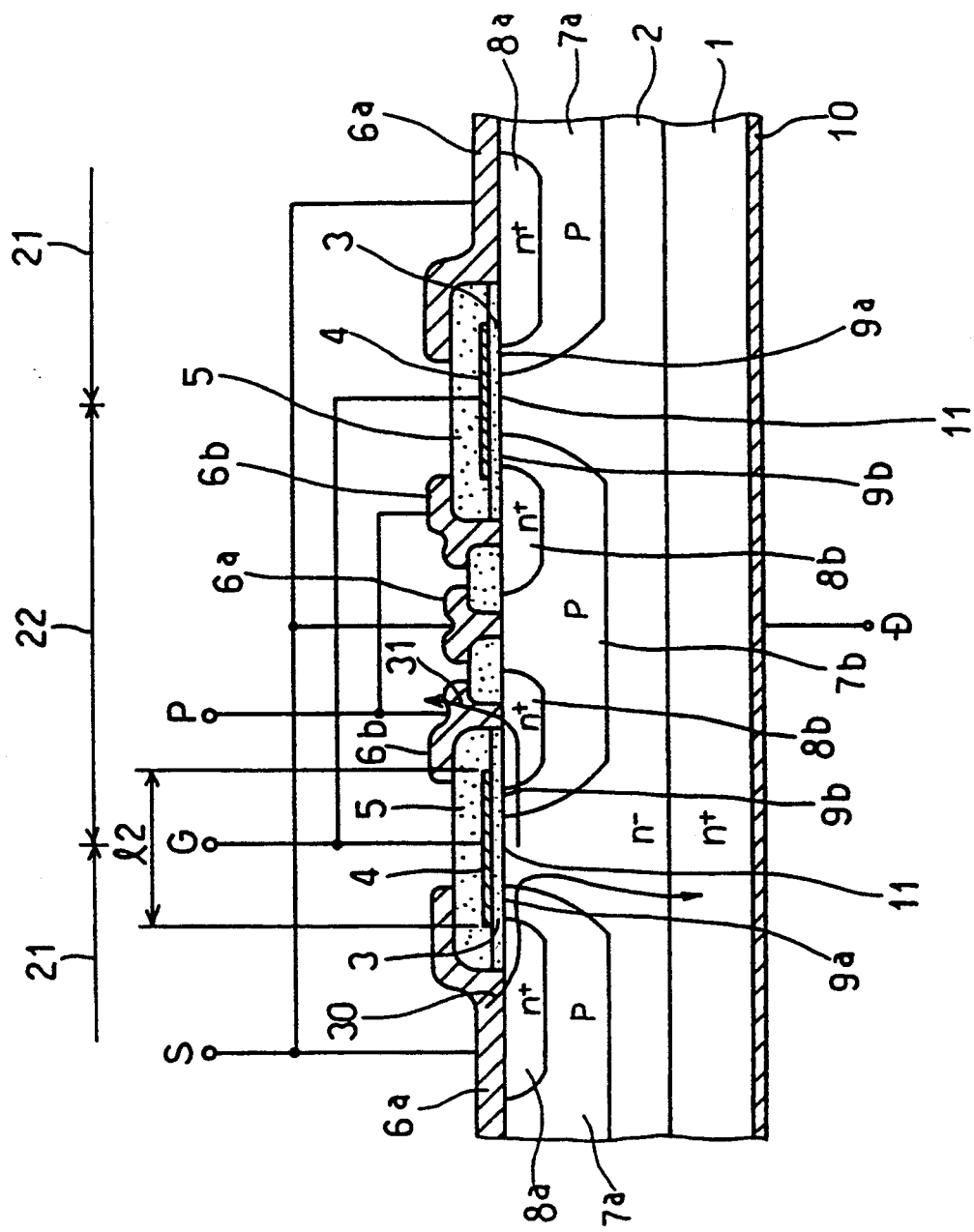
FIG. 6 is a sectional view of conventional n-channel vertical MOSFET provided with a current detecting function utilizing the channel resistance for detecting a current flow.

In FIG. 1 and FIG. 2, the component parts like those in FIG. 6 are denoted by corresponding reference characters and hence description thereof will be omitted. The portion denoted by other reference numerals, i.e., the compensation resistor portion 23, will be described as to its structure and outline of fabrication method.

In the compensation resistor portion 23, by setting up the width 13 of the gate 4 using the gate electrode 4, which is patterned in a predetermined shape, as a mask, a p-type base region 7c is formed by diffusion in the surface of the n⁻-type layer 2 in contiguity with the p-type shield region 7b, and an n⁻-type source region 8d is formed by diffusion in the p-type base region 7c. At the same time as the diffusion of the n⁺-type source region 8d, an n⁺-type drain region 8c is formed by diffusion in the p-type shield region 7b At the time when the p-type shield region 7b and the p-type base region 7c are simultaneously formed by diffusion, the width 13 of the gate electrode is set narrower so that both the regions overlap with each other by lateral diffusion to thereby form a bridge region 12 therebetween, the bridge region 12 electrically shielding the channel 9c from the n⁻-type drain layer 2.

in the lateral MOSFET forming the compensation resistor portion, as shown in the B—B sectional view of FIG. 2, the p-type bridge region 12 is formed under the gate electrode 4, continuously laid along the gate electrode. Accordingly, the insulating film is partly made thicker under the gate electrode contagious to the cell side to thereby form a channel stopper 15 of the channel 9c. This channel stopper 15 can be formed by a LOCOS method simultaneously with a thick field oxide film formed under an electrode pad, not shown. Reference numeral 7d denotes a p-type shield layer for securing withstand voltage, and it can be formed simultaneously with the above described p-type shield region 7b, or a p-type well layer formed in a shield region under a pad, not shown.

The surfaces of the p-type base region 7c and the n⁺-type source region 8d are in ohmic contact with the source electrode 6a and the surface of the n⁺-type drain region 8c is in ohmic contact with a compensation resistor electrode 6c. The compensation resistor electrode 6c is connected with a compensation resistor terminal R.

Now, the process by which the current detection error is compensated for by adding the compensation resistor portion 23 to the power semiconductor device 100 of the above described organization will be described below with reference to characteristics of FIG. 3 and FIG. 4 and the electric circuit diagram of FIG. 5.

Figure 3:
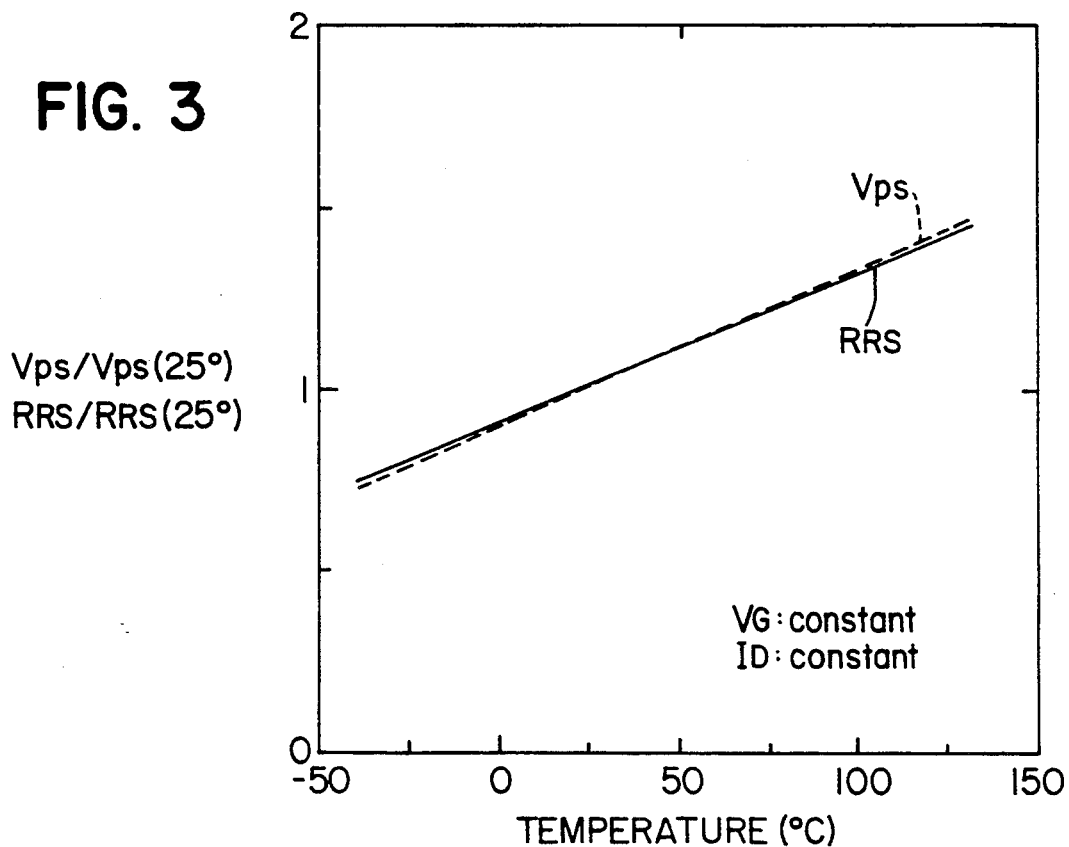
FIG. 3 is temperature characteristics of the detected voltage $V_{PS}$ between the terminals P and S and the resistance $R_{RS}$ between the terminals R and S of the power semiconductor device according to the first embodiment of the present invention.

FIG. 3 shows temperature characteristics. normalized by the values at 25° C., of the detected voltage $V_{PS}$ between the probe terminal P and the source terminal S under the condition that the gate voltage and the drain current are constant (hereinafter briefly referred to as "detected voltage $V_{PS}$") and the resistance $R_{RS}$ between the compensation resistance terminal R and the source terminal S (hereinafter briefly referred to as "resistance $R_{RS}$"). From FIG. 3, it is known that the temperature characteristics of the detected voltage $V_{PS}$ and the resistance $R_{RS}$ are both straight line and these temperature characteristics are conforming well to each other.

Figure 4:
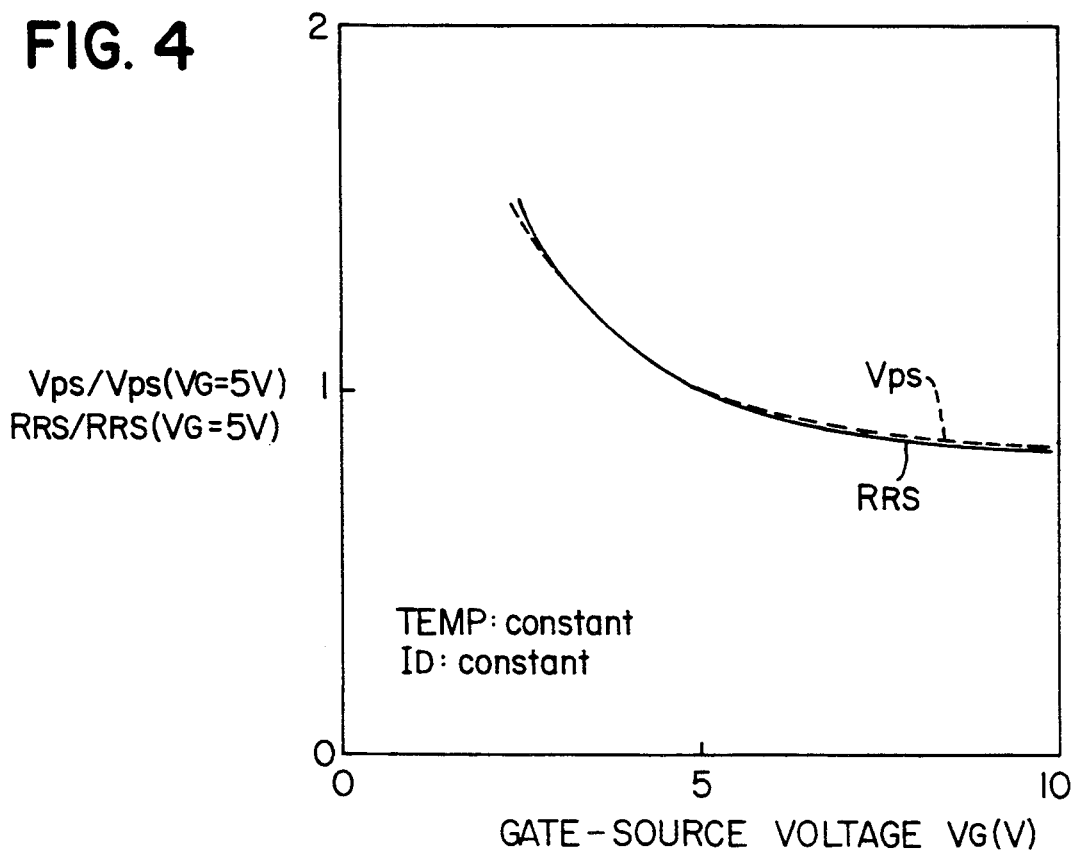
FIG. 4 is gate-voltage characteristics of the detected voltage $V_{PS}$ between the terminals P and S and the resistance $R_{RS}$ between the terminals R and S of the power semiconductor device according to the first embodiment of the present invention.

FIG. 4 shows gate-voltage characteristics of the detected voltage $V_{PS}$ and the resistance $R_{RS}$, normalized by the values at a gate voltage of 5 V, under the condition that the drain current and the temperature are constant. From FIG. 4, it is known that the gate-voltage characteristics of the detected voltage $V_{PS}$ and the resistance $R_{RS}$ are both greatly varying in the region where the gate voltage is low but the gate-voltage characteristics of them are conforming well to each other.

Now, the reasons why the temperature characteristics and the gate-voltage characteristics of the detected voltage $V_{PS}$ and the resistance $R_{RS}$ are in conformity to each other so well will be described. In n-channel MOSFET in general, the channel resistance $R_{CH}$ in the linear operation region in which the voltage $V_D$ is so low as to satisfy $V_D < (V_G - V_T)$, is given by the following expression (1):

$$R_{CH} = \frac{L}{W} \cdot \frac{T_{ox}}{\mu_{eff} \cdot \epsilon_{ox}} \cdot \frac{1}{V_G - V_T} \quad (1)$$

where the threshold voltage $V_T$ is given by $$V_T = V_{FB} + 2\phi_F + \frac{2T_{ox}}{\epsilon_{ox}} \sqrt{\epsilon_{ox} q N_A \phi_F} \quad (2)$$

where, of the parameters in expressions (1) and (2), $V_D$ represents drain voltage, $V_G$ represents gate voltage, $V_T$ represents threshold voltage, $V_{FB}$ represents flat band voltage, L represents gate length, W represents gate width, $T_{ox}$ represents thickness of gate oxide film, $\mu_{eff}$ represents effective mobility in the channel region, $\epsilon_{ox}$ denotes dielectric constant of the gate oxide film, $\phi_F$ denotes surface potential on condition that strong inversion, $N_A$ represents acceptor impurity concentration, and q represents elementary charge.

Referring to FIG. 2A, the channel resistance $R_{CHA}$ of the channel 9a of the current signal generating portion 21 is determined, on the basis of expressions (1) and (2), by the parameters relative to the structure formed of the channel 9a, and the gate oxide film 3 and the gate electrode 4 formed over the channel 9a. The channel resistance $R_{CHC}$ of the channel 9c of the compensation resistor portion 23 is also determined by the parameters relative to the structure formed of the channel 9c, and the gate oxide film 3 and the gate electrode 4 formed over the channel 9c.

The base region 7a, shield region 7b, and base region 7c are simultaneously formed, the source region 8a, drain region 8c, and source region 8d are also simultaneously formed, and the channel 9a and the channel 9c are formed by lateral diffusion by the DSA technique with the gate electrode 4 used as a mask. Also, the gate oxide films 3 over the channel 9a and the channel 9c are simultaneously formed and, further, the gate electrodes 4 over the channel 9a and the channel 9c are simultaneously formed. As the result, the parameters determining the channel resistance $R_{CHA}$ and the channel resistance $R_{CHC}$, especially, those determining the threshold voltages, i.e., $V_{FB}$, $\phi_F$, $T_{ox}$, and $N_A$, become equal to each other, and, the parameters $\mu_{eff}$ in expression (1) in both the channel regions also become equal. Since the gate electrode 4 is common, equal gate voltage $V_G$ is applied to them. Accordingly, the temperature dependency and gate-voltage dependency of the channel resistance $R_{CHA}$ and the channel resistance $R_{CHC}$ become equal to each other. That is, $$R_{CHA} = k_1 \times R_{CHC} \quad (3)$$

where $k_1$ is a constant independent of the temperature and gate voltage.

Now, the relationship between the channel resistance $R_{CHA}$ of the current signal generating portion 21 and the detected voltage $V_{PS}$ will be described. First, the voltage drop $V_{CHA}$ developed across the channel resistance $R_{CHA}$ and the channel current $I_{CHA}$ flowing through it is given by $$V_{CHA} = I_{CHA} \times R_{CHA}. \quad (4)$$

The ratio between the total current flowing through the power control portion 101, i.e., the drain current $I_D$, and the channel current $I_{CHA}$ is equal to the ratio between the unit cells forming these portions and, hence, the following expression (5) holds $$I_{CHA} = k_2 \times I_D \quad (5)$$

where $k_2$ is a constant determined by the structure.

Eliminating $I_{CHA}$ from expressions (4) and (5), we obtain $$V_{CHA} = k_2 \times R_{CHA} \times I_D. \quad (6)$$

The voltage drop $V_{CHA}$ is, as indicated by the path 31 in FIG. 2A, led to the probe terminal P through the accumulation region 11 → channel 9b → n$^+$-type probe region 8b → probe electrode 6b, but when no current or a minute current flows through the path, the voltage drop developed across the resistance $R_{ACC}$ of the accumulation region 11 and the resistance $R_{CHB}$ of the channel 9b becomes null. Therefore, the voltage $V_{CHA}$ is led to the probe terminal P suffering no change, hence $$V_{PS} = V_{CHA}. \quad (7)$$

Replacing $V_{CHA}$ in expression (6) by $V_{PS}$ according to expression (7), we obtain $$V_{PS} = k_2 \times R_{CHA} \times I_D. \quad (8)$$

Eliminating $R_{CHA}$ from expressions (3) and (8), we obtain $$V_{PS} = k_1 \times k_2 \times I_D \times R_{CHC}. \quad (9)$$

Since it is apparent that the channel resistance $R_{CHC}$ is virtually equal to the resistance $R_{RS}$ between the compensation resistor terminal R and the source terminal S, by replacing $R_{CHC}$ in expression (9) by $R_{RS}$, we obtain $$V_{PS} = k_1 \times k_2 \times I_D \times R_{RS}. \quad (10)$$

From the expression (10), it is apparent that the detected voltage $V_{PS}$ is proportional to the resistance $R_{RS}$ when the drain current $I_D$ is constant, and thus, it is proven that they have the same temperature dependency and gate-voltage dependency.

Now, description about actual use of the power semiconductor device 100 having the current detecting portion and the current detection error compensation portion shown in FIG. 1 and FIG. 2 will be given using the electric circuit diagram of FIG. 5. FIG, 5 shows an example of electric circuit diagram for outputting a highly accurate current signal with the current detection error compensated for, in which, broadly speaking, a reference current is supplied to the compensation resistor terminal R so that the potential difference between the probe terminal P and the compensation resistor terminal R of the power semiconductor device 100 may become zero and the current value at this time is converted into a voltage value by means of a fixed resistor to be output as a signal.

The structure of FIG. 5 will now be described. The gate terminal G is connected with a signal generator, not shown, and a driving signal for operating the power semiconductor device 100 is supplied to the gate terminal G. The drain terminal D is connected with the positive terminal of a DC current source 210 through a load. The probe terminal P is connected with the noninverting input terminal of an operational amplifier 201. The compensation resistor terminal R is connected with both the inverting input terminal of the operational amplifier 201 and the emitter terminal of a transistor 202. The base terminal of the transistor 202 is connected with the output terminal of the operational amplifier 201 and the collector terminal is connected with the positive terminal of a DC current source 211 through a fixed resistor 203. The source terminal S is commonly connected with the negative terminals of the DC current sources 210 and 211.

The operation of the above described arrangement will be described below. Referring to FIG. 5, the reference current $I_R$ flows, by way of the compensation resistor terminal R, into the compensation resistor portion 23 as indicated by the path 32 in FIG. 2A to thereby produce a reference voltage $V_{RS}$ by means of the resistor $R_{RS}$ between the compensation resistor terminal R and the source terminal S. Using the resistance $R_{RS}$, the voltage $V_{RS}$ is given by $$V_{RS} = I_R \times R_{RS}. \quad (11)$$

The operational amplifier 201 detects the difference $\Delta V$ between the reference voltage $V_{RS}$ and the detected voltage $V_{PS}$ and provides feedback control so that the difference $\Delta V$ may become zero by increasing or decreasing the reference current $I_R$ through the transistor 202. As a result, the following expression (12) comes to hold:

$$V_{RS} = V_{PS}. \quad (12)$$

By substituting expressions (10) and (11) in expression (12) to thereby eliminate $V_{RS}$ and $V_{PS}$, we obtain $$I_R = k_1 \times k_2 \times I_D. \quad (13)$$

By this expression (13), it is proven that the reference current $I_R$ has a value proportional to the value of the drain current $I_D$ of the power control portion.

Figure 5:
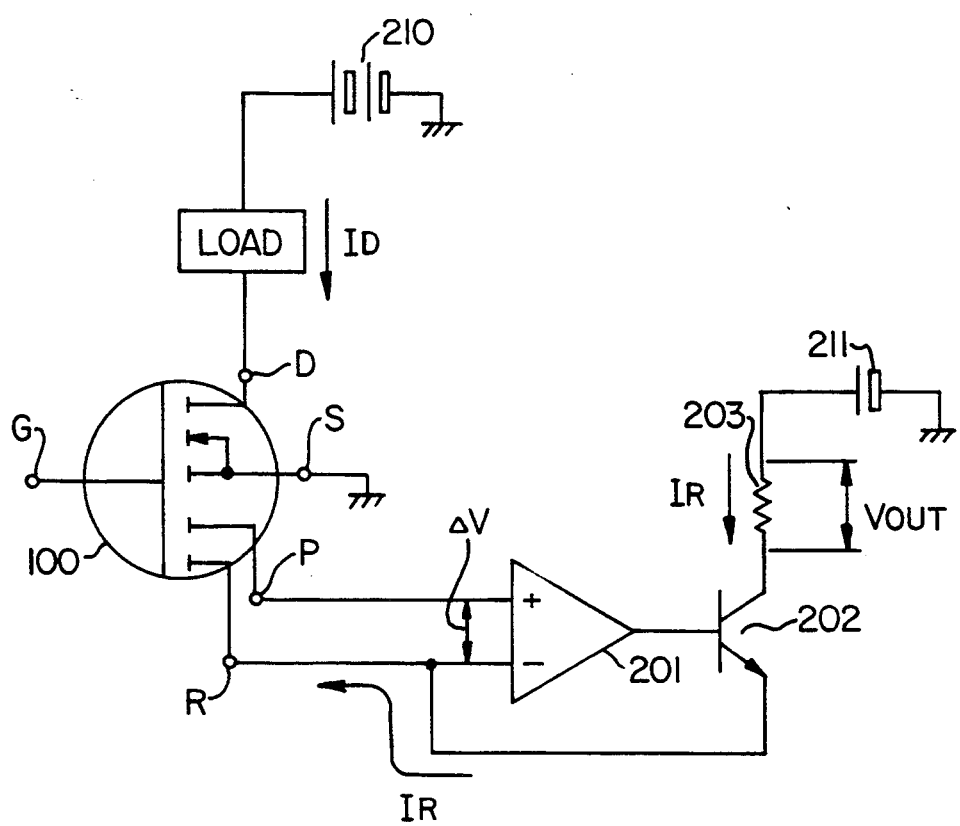
FIG. 5 is an electric circuit diagram of a circuit using the power semiconductor device according to the first embodiment of the present invention for outputting a highly accurate current detection signal.

In FIG. 5, a transistor having a sufficiently large current gain is used as the transistor 202, so that the emitter current and the collector current are virtually equal to each other. Accordingly, the reference current $I_R$ also flows, by way of the collector terminal, into the fixed resistor 203. Thus, the output $V_{OUT}$ as the signal of the current assumes the value proportional to the drain current $I_D$ given by $$V_{OUT} = I_R \times R_L = k_1 \times k_2 \times R_L \times I_D \quad (14)$$

where $R_L$ represents the resistance value of the fixed resistor 203.

According to the first embodiment as described above, current detection with high accuracy independent of the temperature and gate voltage can be achieved by means of the n-channel vertical MOSFET.

Second Embodiment

Figure 7:
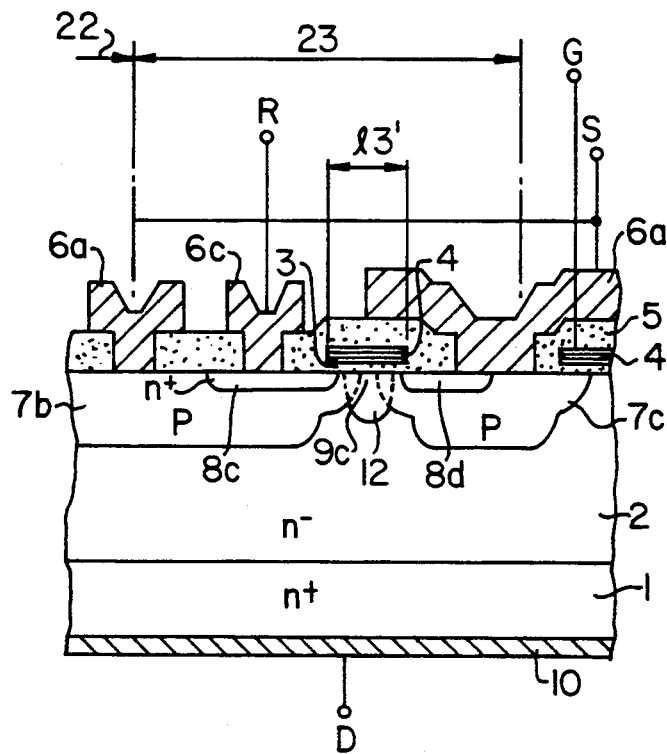
FIG. 7 is a sectional view of the main portion of n-channel vertical MOSFET showing a second preferred embodiment of a power semiconductor device according to the present invention.

FIG. 7 is a sectional view of the main portion of a power semiconductor device according to a second embodiment of the present invention showing only the compensation resistor portion, which is different from that in the first embodiment. Component parts in FIG. 7 common with those in FIG. 6 and FIG. 2 are denoted by corresponding reference numerals and hence description of the same will be omitted. The structure designated by other reference numerals and its fabrication method will be described below.

Referring to FIG. 7, when the p-type shield region 7b and the p-type base region 7c are simultaneously formed by diffusion with the gate electrode 4 used as a mask, the width 13' of the gate electrode 4 is set wider so that both the regions may be a predetermined distance apart even if lateral diffusion takes place, and this is the point in which the present embodiment is different from the first embodiment. Further, in order that the channel 9c is electrically shielded from the n⁻-type drain layer 2, there is previously formed a p-type bridge region 12 by ion implantation or the like in the region located between the p-type shield region 7b and the p-type base region 7c in such a manner that it partly overlaps with the p-type shield region 7b and the p-type base region 7c.

The same effect as obtained in the above described first embodiment can be obtained by the present embodiment.

Third Embodiment

Figure 8:
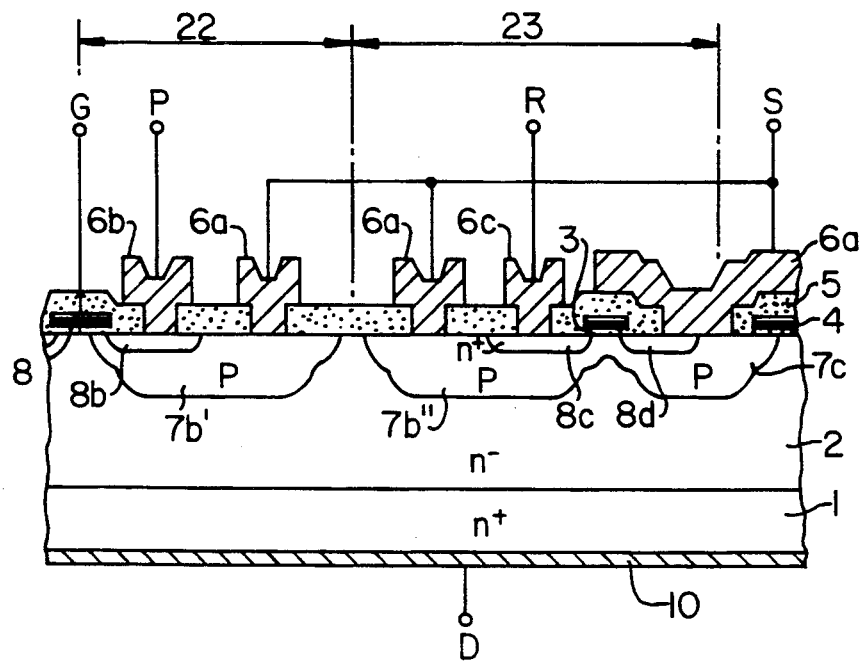
FIG. 8 is a sectional view of the main portion of n-channel vertical MOSFET showing a third preferred embodiment of a power semiconductor device according to the present invention.

FIG. 8 is a sectional view of the main portion of a power semiconductor device according to a third embodiment of the present invention showing only the current signal detecting portion and the compensation resistor portion, which are different from those in the first embodiment. Component parts in FIG. 8 common with those in FIG. 6 and FIG. 2 are denoted by corresponding reference numerals and hence description of the same will be omitted. The structure designated by other reference numerals will be described below. The point in which FIG. 8 differs from FIG. 2A is that the p-type shield region 7b is separated into two regions of a p-type shield region 7b' and a p-type shield region 7b''. The two regions have their surfaces in ohmic contact with the source electrode 6a. The same effect as obtained in the first embodiment can be obtained also by the present arrangement.

Fourth Embodiment

Figure 9:
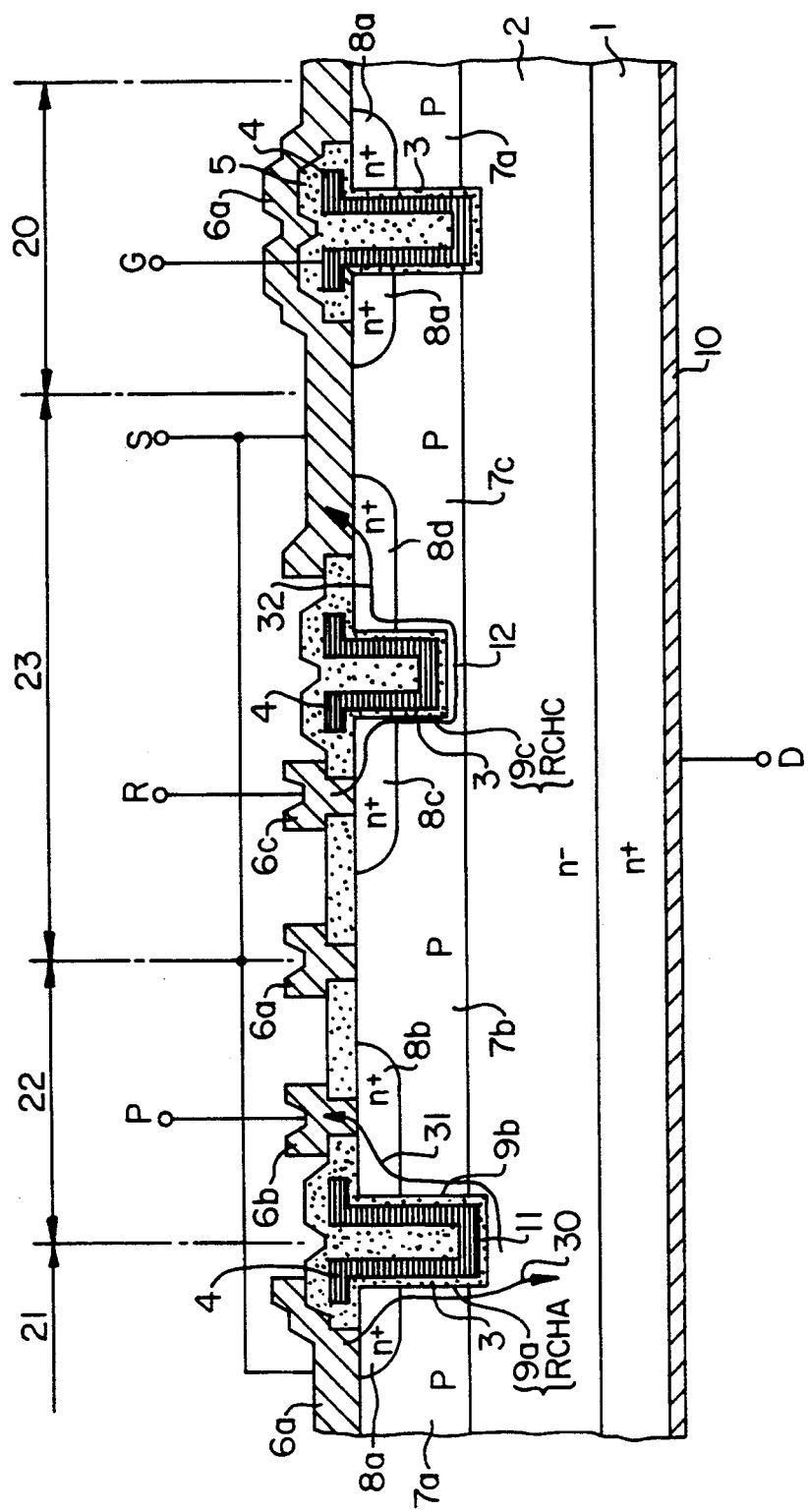
FIG. 9 is a sectional view of the main portion of n-channel vertical MOSFET showing a fourth preferred embodiment of a power semiconductor device according to the present invention.

FIG. 9 is a sectional view of the structure of a power semiconductor device according to a fourth embodiment of the invention and shows the case where the present invention is applied to n-channel vertical MOSFET of a trench gate structure. In FIG. 9, component parts functionally or structurally in common with those in FIG. 2A are denoted by corresponding reference numerals and hence description of the same will be omitted.

Referring to FIG. 9, the structure and its fabrication method will be described. On the surface of the n⁻-type drain layer 2, a p-type diffused layer is formed in a predetermined region of the unit cell 20 of the power control portion 101 and the current signal generating portion 21 and an n⁺-type diffused layer is formed in the p-type diffused layer. A trench gate structure is formed through the p-type diffused layer and the n⁺-type diffused layer, and a gate oxide film 3, a gate electrode 4, and channels 9a and 9b are formed on the side walls of the trench gate structure. At the same time as the formation of the trench gate structure, the p-type base region 7a, the p-type shield region 7b, the n⁺-type source region 8a, and the n⁺-type probe region 8b are dividedly formed.

Now, the compensation resistor portion 23 will be described. A p-type diffused layer is formed on the surface of the n⁻-type drain layer 2 in a predetermined region of the compensation resistor portion 23 and an n⁺-type diffused layer is formed in the p-type diffused layer. A trench gate structure is formed such that the trench is passed through the n⁺-type diffused layer but the bottom of the trench is stopped halfway through the p-type diffused layer. On the side walls, there are formed a gate oxide film 3, a gate electrode 4, and a channel 9c. At the same time as the formation of the trench gate structure, the p-type base region 7c, the n⁺-type drain region 8c, and the n⁺-type source region 8d are dividedly formed. The p-type diffused layers, n⁺-type diffused layers, gate oxide films 3, and gate electrodes 4 of the unit cell 20, current signal generating portion 21, current signal detecting portion 22, and compensation resistor portion 23 can be formed at the same time.

Also in the second, third, and fourth embodiments shown in FIGS. 7, 8, and 9, the effects of the present invention can be obtained the same as before and characteristics equivalent to those shown in FIG. 3 and FIG. 4 can be provided. Further, by providing the arrangement as shown in the electric circuit diagram of FIG. 5, the effects of compensation for the temperature and gate voltage equivalent to those obtained in the first embodiment can be obtained. Thus, an n-channel vertical MOSFET having a highly accurate current detecting function can be provided.

Fifth Embodiment

Figure 10:
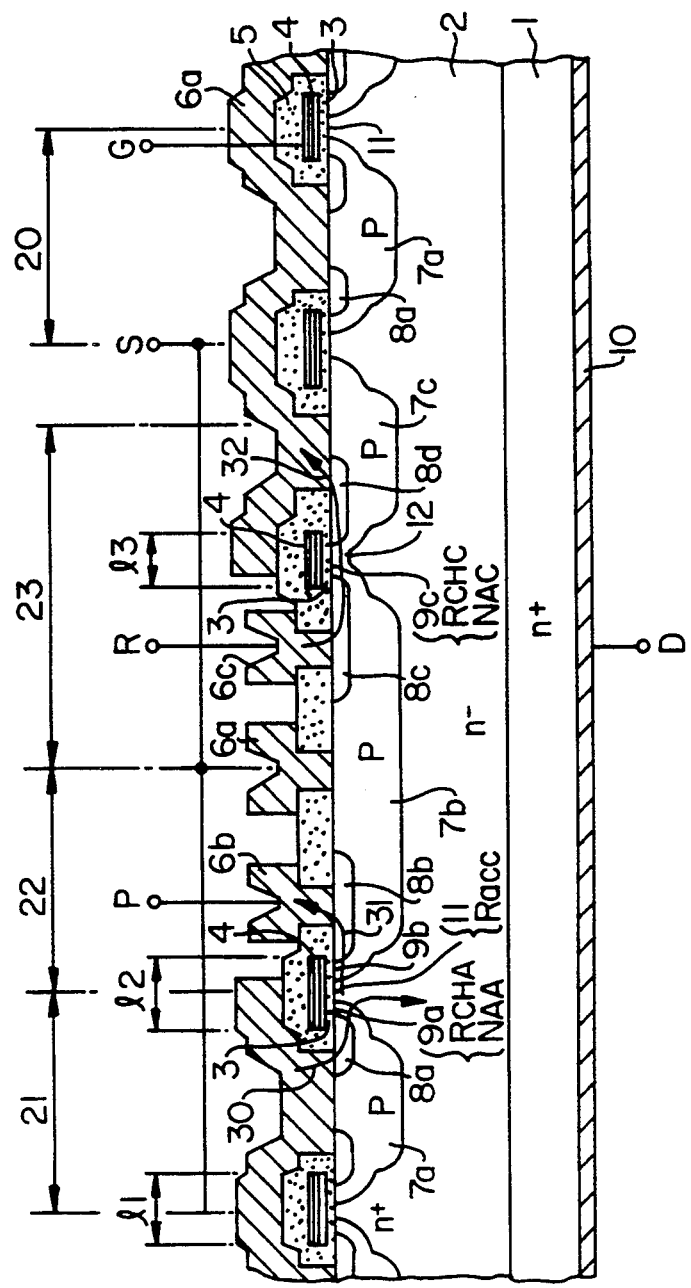
FIG. 10 is a sectional view of the main portion of n-channel vertical MOSFET showing a fifth preferred embodiment of a power semiconductor device according to the present invention.

FIG. 10 is a sectional view showing the structure of a power semiconductor device according to a fifth embodiment of the present invention, in which component parts common with those in FIG. 2A are denoted by corresponding reference numerals and hence description of the same will be omitted. Below will be given description of the structure of the portion characteristic of the present embodiment and outline of its fabrication method.

Broadly speaking, the fifth embodiment relates to a method to improve the current detecting accuracy by decreasing the difference of several % in the gate-voltage characteristics between the detected voltage $V_{PS}$ and the resistance $R_{RS}$ shown in FIG. 4 by changing the impurity concentration $N_{AC}$ in the channel portion of the compensation resistor portion 23 and the impurity concentration $N_{AA}$ in the channel portion of the current signal generating portion 21 thereby changing the threshold voltage.

Referring to FIG. 10, in the step preceding the formation of the gate electrode 4, a predetermined amount of n-type or p-type impurity is diffused in the portion of the compensation resistor portion 23 where the channel 9c is to be formed. Meanwhile, the portions of the unit cell 20 and the unit cell for current detection of the current signal generating portion 21 where the channel 9a (in the fifth embodiment, the channel 9a shall designate not only the channel of the unit cell of the current signal generating portion 21 but also the channel of the unit cell 20 of the power control portion 101) is to be formed is not diffused with such impurity.

As the result, the threshold voltage $V_{TC}$ of the channel 9c of the compensation resistor portion 23 can be changed by $\Delta V_{TC}$ (hereinafter referred to as "threshold voltage shift amount"). That is, $$V_{TC}' = V_{TC} - \Delta V_{TC} \tag{15}$$

where, $V_{TC}$ and $V_{TC}'$ represent threshold voltages when the threshold voltage is controlled and not controlled, respectively. The shift amount $\Delta V_{TC}$ can be controlled by the amount of the diffused impurity (hereinafter referred to as "threshold voltage controlling impurity diffusion") in the channel 9c.

Now, the factors in determination of the most favorable threshold voltage shift amount $\Delta V_{TC}$ will be described.

First, if, in forming the bridge region 12 in the compensation resistor portion 23 shown in FIG. 2A, the p-type shield region 7b and the p-type base region 7c are closely formed so as to partly overlap with each other by lateral diffusion, the impurity concentration distribution in the channel 9c changes from that in the case where they are not closely formed. More specifically, while the impurity distribution when the region 7b and the region 7c are not closely formed is that corresponding to the channel 9a of the current signal generating portion 21 in FIG. 2A and hence the threshold voltage assumes the value equal to the threshold voltage $V_{Ta}$ of the channel 9a, the value increases by $\Delta V_{TC1}$ when those regions are closely formed so as to partly overlap with each other. Thus, the following relationship holds:

$$V_{TC} = V_{Ta} + \Delta V_{TC1} \tag{16}$$

Accordingly, if the threshold voltage of the channel 9c can be decreased by $\Delta V_{TC1}$ by the threshold voltage controlling impurity diffusion, the component of the difference in the gate-voltage characteristic between the detected voltage $V_{PS}$ and the resistance $R_{RS}$ shown in FIG. 4 due to the change in the impurity distribution can be eliminated. The current detecting accuracy can be improved especially in the voltage region where the gate voltage is as low as below 5 V, for example.

Secondly, in the case of the first embodiment, the detected voltage $V_{PS}$ was considered as related only to the voltage drop $V_{CHA}$ developed across the resistance $R_{CHA}$ of the channel 9a of the current signal generating portion 21 in FIG. 2A, but, strictly speaking, there is the resistance $R_{ACC}$ of the accumulation region 11, may it be smaller than the resistance $R_{CHA}$, and therefore, the detected voltage $V_{PS}$ is equal to that voltage drop plus the voltage drop $V_{ACC}$ by this resistance, that is $$V_{PS} = V_{CHA} + V_{ACC}. \tag{17}$$

On the other hand, the component of the resistance $R_{RS}$ is only the resistance $R_{CHC}$ of the channel 9c.

Now, since the gate-voltage dependency of the channel is greater than that of the accumulation region, the gate voltage dependency of the detected voltage $V_{PS}$ is smaller than that of the resistance $R_{RS}$. Since the channel resistance $R_{CH}$ is inversely proportional to $(V_C - V_T)$ according to the expression (1), the gate-voltage dependency of the resistance $R_{CH}$ can be decreased by setting $V_T$ smaller. Making use of this relationship to reduce the difference in the gate-voltage dependency between the detected voltage $V_{PS}$ and the resistance $R_{RS}$ shown in FIG. 4, the threshold voltage $V_{TC}$ of the channel 9c of the compensation resistor portion 23 is decreased by $\Delta V_{TC2}$ by threshold voltage controlling impurity diffusion, so that $$V_{TC}' = V_{TC} - \Delta V_{TC2}. \quad (18)$$

By such method, with regard to the difference in the gate-voltage characteristic between the detected voltage $V_{PS}$ and the resistance $R_{RS}$, the component dependent on existence or nonexistence of the accumulation region 11 can be eliminated. Thus, the current detecting accuracy can be improved especially in the gate voltage region as high as over 5 V, for example.

According to the description so far given, the sum total of the value $\Delta V_{TC1}$ given in the expression (16) and the value $\Delta V_{TC2}$ given in the expression (18) is set to be the threshold voltage shift amount $\Delta V_{TC}$ given in the expression (15), that is, $$V_{TC} = \Delta V_{TC1} + \Delta V_{TC2}. \quad (19)$$

Thus, in the compensation resistor portion 23 of the present embodiment shown in FIG. 10, by having the threshold voltage $V_{TC}$ shifted by the amount $\Delta V_{TC}$ given in the expression (19) by means of the threshold voltage controlling impurity diffusion as described above, the difference in the gate-voltage characteristics between the detected voltage $V_{PS}$ and the resistance $R_{RS}$ shown in FIG. 4 can be greatly reduced. By organizing the electric circuit as shown in FIG. 5 using the power semiconductor device configured as shown in FIG. 10, current detection with very high accuracy can be achieved.

Sixth Embodiment

Figure 11:
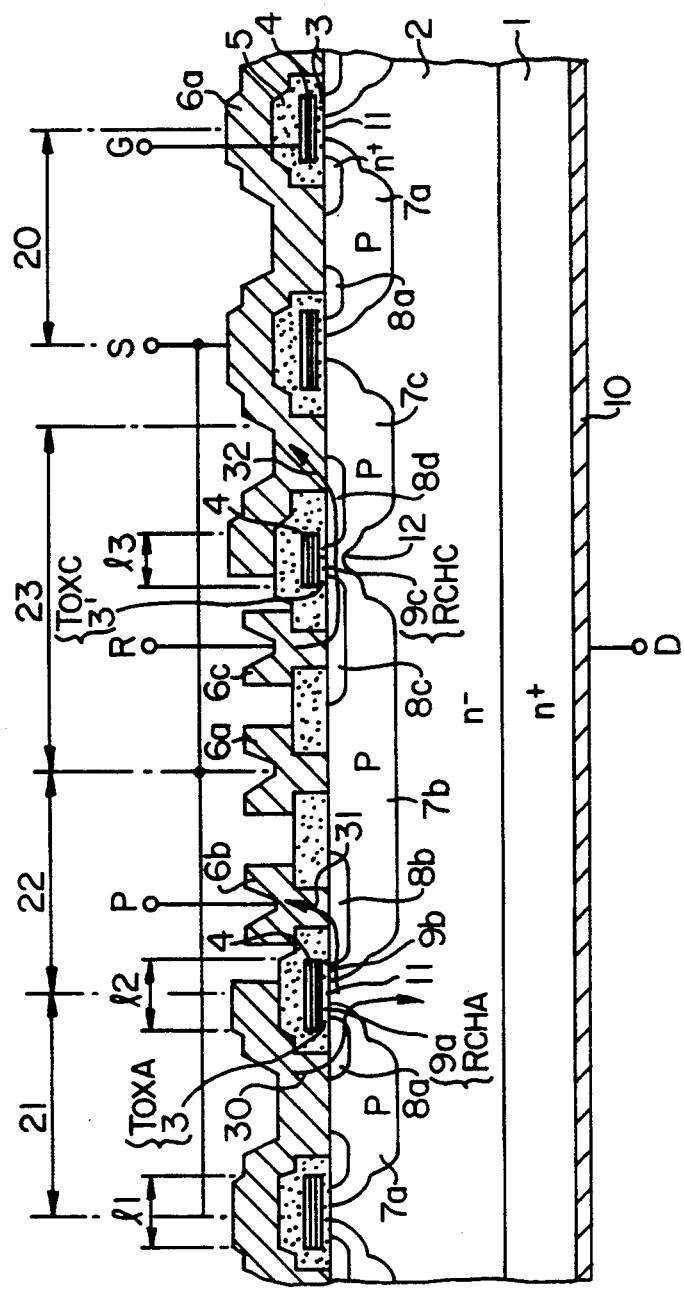
FIG. 11 is a sectional view of the main portion of n-channel vertical MOSFET showing a sixth preferred embodiment of a power semiconductor device according to the present invention.

FIG. 11 is a sectional view showing structure of a power semiconductor device according to a sixth embodiment of the present invention. Component parts in FIG. 11 common with those in FIG. 2A are denoted by corresponding reference numerals and hence description of the same will be omitted. Below will be given description of the structure of the portion characteristic of the present embodiment and outline of its fabrication method.

Broadly speaking, the sixth embodiment has for its object the improvement in the current detecting accuracy by decreasing the difference of several % in the gate-voltage characteristic between the detected voltage $V_{PS}$ and the resistance $R_{RS}$ shown in FIG. 4 and relates to a method to change the threshold voltage by changing the thickness of the gate oxide film of the compensation resistor portion 23.

Referring to FIG. 11, in the process of formation of the gate oxide film, the thickness $T_{OXC}$ of the gate oxide film 3' of the compensation resistor portion 23 is set to be thinner than the thickness $T_{OXA}$ of the gate oxide film 3 of the unit cell 20 (in the sixth embodiment, the unit cell 20 shall designate not only the unit cell of the power control portion 101 but also the unit cell of the current signal generating portion 21), that is, $$T_{OXC} < T_{OXA}. \quad (20)$$

Thereby, according to the expression (2), the threshold voltage $V_{TC}$ of the channel 9c of the compensation resistor portion 23 can be changed by $\Delta V_{TC}$ (hereinafter referred to as "threshold voltage shift amount"). That is, $$V_{TC}' = V_{TC} - V_{TC} \quad (21)$$

where $V_{TC}$ and $V_{TC}'$ represent the threshold voltages at the time when $T_{OXC} = T_{OXA}$ and $T_{OXC} < T_{OXA}$, respectively.

Since the expression (21) is the same as the expression (15) in the embodiment 5, by providing the threshold voltage with the threshold voltage shift amount $\Delta V_{TC}$ given by the expression (19), the same effect as obtained in the Fifth embodiment can be obtained in the sixth embodiment and the difference in the gate-voltage characteristic between the detected voltage $V_{PS}$ and the resistance $R_{RS}$ shown in FIG. 4 can be greatly reduced. By organizing the electric circuit as shown in FIG. 5 using the power semiconductor device having the structure shown in FIG. 11, highly accurate current detection becomes achievable.

Although description has been given above only as to the structure shown in FIG. 11, the same effect as obtained in FIG. 11 can be obtained when the present embodiment is applied to other structures shown in FIG. 7, FIG. 8, and FIG. 9.

Seventh Embodiment

Figure 12:
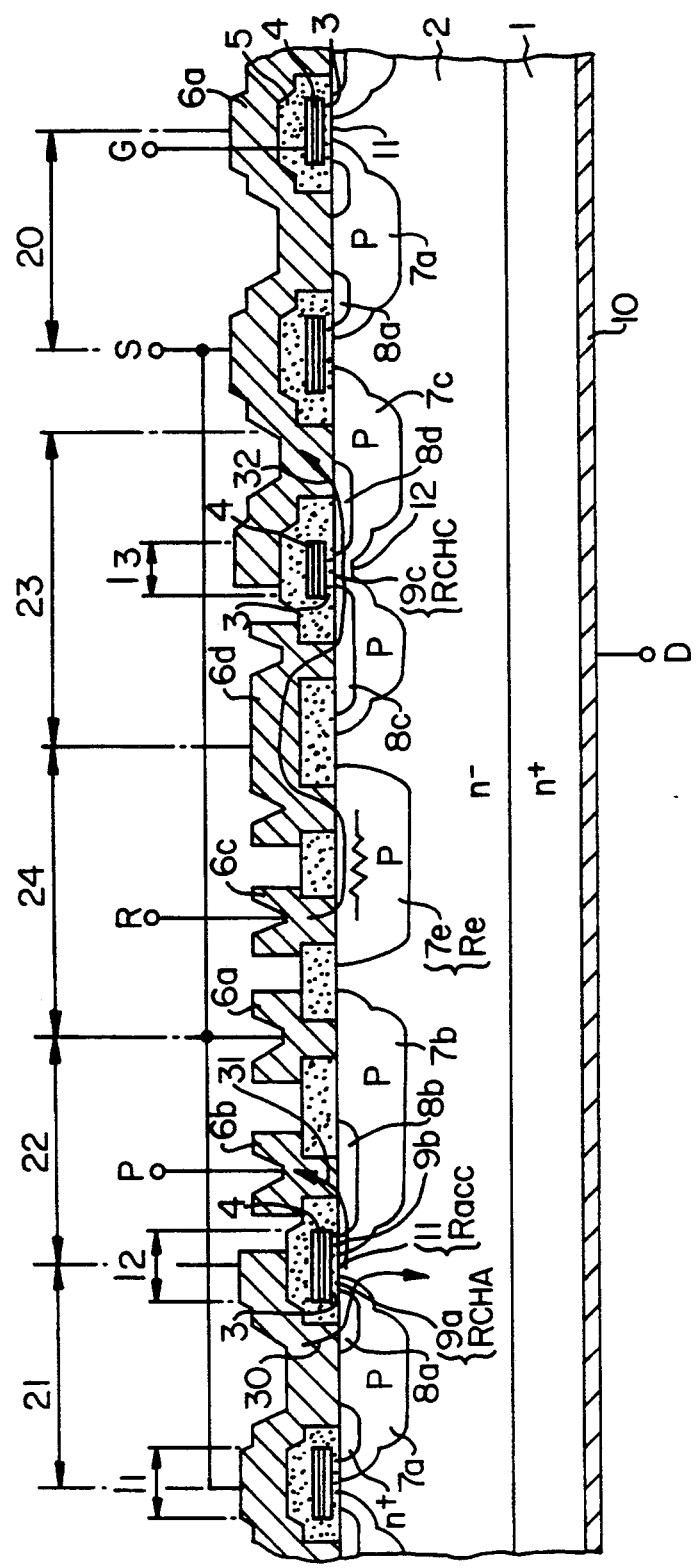
FIG. 12 is a sectional view of the main portion of n-channel vertical MOSFET showing a seventh preferred embodiment of a power semiconductor device according to the present invention.

FIG. 12 is a sectional view showing structure of a power semiconductor device according to a seventh embodiment of the present invention. Component parts in FIG. 12 common with those in FIG. 2A are denoted by corresponding reference numerals and hence description of the same will be omitted. Below will be given description of the structure of the portion characteristic of the present embodiment and outline of its fabrication method.

Broadly speaking, the seventh embodiment has for its object the improvement in the current detecting accuracy by decreasing the difference of several % in the gate-voltage characteristic between the detected voltage $V_{PS}$ and the resistance $R_{RS}$ shown in FIG. 4. In the present embodiment, a diffused resistance is serially added to the compensation resistor portion 23 constituted of the channel resistance $R_{CHC}$. In FIG. 12, the p-type diffused layer 7e formed in the region 24 corresponds to the diffused resistance. The p-type diffused layer 7e can be formed simultaneously with the diffusion of the p-type regions 7a, 7b, and 7c, and it can be arranged so as to have a later described resistance value Re by having its impurity concentration, size (shape), etc. set up. Further, the electrode 6d connecting the diffused layer 7e of the region 24 with the n+-type drain region 8c of the region 23 can be formed simultaneously with the source electrode 6a. In constructing the present arrangement, the number of fabrication steps does not increase in substance.

Now, the resistance value Re provided by the p-type diffused layer 7e will be described. With reference to FIG. 2A, as indicated in the description of the fifth embodiment using the expression (17), the gate-voltage dependency of the detected voltage $V_{PS}$ is smaller than that of the channel resistance $R_{CHC}$, i.e., the compensation resistance $R_{RS}$. Meanwhile, referring to FIG. 12, the compensation resistance $R_{RS}$ includes the diffused resistance Re in addition to the channel resistance $R_{CHC}$, that is, $$R_{RS} = R_{CHC} + Re. \quad (22)$$

Since, here, the resistance Re is independent of the gate voltage, the gate-voltage dependency of the compensation resistor $R_{RS}$ can be decreased by enlarging the value of the resistance Re while keeping the value of the resistance $R_{CHC}$ constant. Therefore, by suitably setting the value of the resistance Re according to the value of the resistance $R_{ACC}$ of the accumulation region 11, which is also independent of the gate voltage, and controlling the shape of the diffused layer 7e, the difference in the gate-voltage dependency between the detected voltage $V_{PS}$ and the gate-voltage dependency of the resistance $R_{RS}$ can be reduced, and thereby, the current detecting accuracy can be improved especially in the region where the gate voltage is as high as over 5 V, for example.

By the provision of the p-type diffused layer 7e, the difference of several % in temperature dependency between the detected voltage $V_{PS}$ and the resistance $R_{RS}$ shown in FIG. 3 can also be reduced.

The temperature dependency of the detected voltage $V_{PS}$ is expressed as the sum total of the temperature dependency of $V_{CHA}$ and the temperature dependency of $V_{ACC}$ in accordance with the expression (17), while the temperature dependency of the resistance $R_{RS}$ is expressed as the sum total of the temperature dependency of $R_{CHC}$ and the temperature dependency of Re in accordance with the expression (22). The difference in temperature dependency between the two will be reduced by setting the TCR (temperature coefficient of resistance) to a predetermined value, while keeping the temperature dependency of $V_{CHA}$, $V_{ACC}$, and $R_{CHC}$, to equalize the temperature dependency of $V_{PS}$ and $R_{RS}$.

Below will be described the setting up of the TCR of the diffused resistance Re.

It is known that the diffused resistance generally decreases with increase of the impurity concentration. Therefore, the setting up of the TCR can be achieved by setting up the impurity concentration of the p-type diffused layer 7e.

In FIG. 12, the p-type regions 7a, 7b, and 7c are in reality formed of a deep diffused layer determining the withstand voltage between the drain and the source and a shallow diffused layer forming the channel portion. These two layers are set to be different in impurity concentration such that the shallow layer has lower impurity concentration and, hence, the coefficients TCR of the two ($TCR_1$, $TCR_2$) are different ($TCR_1 < TCR_2$).

Accordingly, when the predetermined coefficient TCR to be provided for the p-type diffused layer 7e lies between $TCR_1$ and $TCR_2$, the difference of several % in the temperature dependency can be eliminated by combining the deep diffusion and the shallow diffusion in the p-type diffused layer 7e at a desired ratio. The predetermined coefficient TCR can also be obtained by forming a diffused layer with a predetermined impurity concentration.

For example, in the case where the temperature dependency of $V_{CHA}$, i.e., TCR of $R_{CHA}$, and TCR of $R_{CHC}$ are equal, good results can be achieved by setting up the value of the diffused resistance Re in accordance with the value of the resistance $R_{ACC}$ of the accumulation region 11 and, in addition, setting up the shape, impurity concentration, etc. of the p-type diffused layer 7e so that coefficients TCR of Re and $R_{ACC}$ may become equal.

According to the present embodiment as described in the foregoing, the difference in the gate-voltage characteristic between the detected voltage $V_{PS}$ and the resistance $R_{RS}$ shown in FIG. 4 can be greatly reduced and, at the same time, the difference in the temperature characteristic between the two shown in FIG. 3 can be greatly reduced. Thus, by organizing the electric circuit shown in FIG. 5 using the power semiconductor device including the arrangement shown in FIG. 12, current flow detection with very high accuracy becomes achievable.

In the description of various embodiments given above, the cases where insulated gate-type power semiconductor devices, which comprise a compensation resistor portion having a channel portion of the same structure as the channel portion of the unit cell of the power control portion, and in which the resistance of the compensation resistor portion and the resistance of the channel portion of the unit cell of the power control portion are arranged to have resistance characteristics equal to each other, are applied as preferred examples to n-channel vertical MOSFET have been described, but various changes and modifications of the embodiment, and combination of some embodiments may be made by those skilled in the art.

For example, while only the n-channel-type has been shown in the above described embodiments, the present invention is applicable also to the p-channel-type by changing, then, semiconductors of the type p into those of the type n, and those of the type n into those of the type p, of each layer and region constituting vertical MOSFET. Although only the cases of vertical MOSFET have been mentioned in the above described embodiments, the present invention is also applicable to insulated-gate bipolar transistors, in which case, what is different from the case of the vertical MOSFET is that the type of the semiconductor of the substrate is opposite.

Although, in the above described first to fourth embodiments, the compensation resistor portion has been such that includes a channel portion of the same structure as the channel portion of the unit cell constituting the power control portion, it is not an important factor that they are of the same structure. The same compensation effect can of course be obtained if the electric characteristic of the channel resistance of the channel portion is arranged to be well symmetrical to that of the unit cell.

Although, in the circuit diagram of FIG. 5, only the case where voltages $V_{PS}$ and $V_{RS}$ are controlled to become equal was described, the same effect can be obtained in substance if $V_{PS}$ and $V_{RS}$ are controlled to have a predetermined ratio. For example, the same effect can be obtained even if the voltage $V_{PS}$ is input to the positive input terminal of the operational amplifier 201 after being attenuated by an attenuator.

What is claimed is:

1. A power semiconductor device comprising:
   a semiconductor substrate;
   a power control portion formed on said semiconductor substrate constituted of a plurality of vertical unit cells of an insulated grate structure connected in parallel, each unit cell having a gate electrode and a channel portion;
   a current signal detecting portion formed on said semiconductor substrate adjacent to at least a portion of said unit cells constituting said power control portion for detecting current flowing through said power control portion through detection of a voltage drop developed across a resistance of said channel portion; and
   a lateral transistor structure formed on said semiconductor substrate and including a resistive channel portion and a gate electrode,
   said gate electrodes of said lateral transistor structure and of said unit cells being connected mutually, said resistive channel portion of said lateral transistor structure having a resistance characteristic which is approximately equal to a resistance characteristic of the channel portion so as to compensate for a current detection error by using said resistive channel portion of said lateral transistor structure.

2. A power semiconductor device according to claim 1, wherein the channel portion of said unit cell is of a trench gate structure.

3. A power semiconductor device according to claim 2, wherein said power control portion, said current signal detecting portion, and said lateral transistor structure are formed on a surface of a first drain layer of a first conduction type in predetermined regions,
   said unit cell being of a trench gate structure,
   said current signal detecting portion being adapted to output a voltage drop developed in a first channel formed on one side wall of the trench gate structure of said unit cell of a portion of said power control portion to a probe electrode through a second channel formed on the other side wall,
   said lateral transistor structure operating in association with said unit cell of the trench gate structure and being adapted such that said resistive channel portion is connected to a compensation resistor terminal and said resistive channel portion includes a shield region whereby said resistive channel portion is prevented from being affected by a drain electrode potential.

4. A power semiconductor device according to claim 3, further comprising:
   current supply means for supplying a reference current to said compensation resistor electrode; and
   operational control means for controlling said current supply means so that a signal output to said probe electrode and a voltage drop developed across said resistive channel portion have a predetermined ratio therebetween thereby increasing or decreasing said reference current; whereby
   said reference current is a current detection signal corresponding to a current flowing through said power control portion.

5. A power semiconductor device according to claim 1, wherein the channel portion of said unit cell and the channel portion of said lateral transistor structure are simultaneously formed by self-aligned diffusion.

6. A power semiconductor device according to claim 5, wherein said power control portion, said current signal detecting portion, and said lateral transistor structure are formed on a surface of a first drain layer of a first conduction type in predetermined regions,
   said unit cell having said gate electrode formed over the surface of said first drain layer with a gate insulating film interposed therebetween and having a first base region of a second conduction type, a first source region of the first conduction type, and a first channel located under an end portion of said gate electrode aligned with respect to said gate electrode,
   said current signal detecting portion having a gate electrode formed over the surface of said first drain layer with a gate insulating film interposed therebetween and having a first shield region of the second conduction type, a probe region of the first conduction type, and a second channel located under said gate electrode of the current signal detecting portion aligned with respect to said gate electrode of the current signal detecting portion, said second channel adjoining said first channel,
   said lateral transistor structure having said gate electrode formed over the surface of said first drain layer with a gate insulating film interposed therebetween and, in order to form a lateral MOSFET to be controlled by said gate electrode thereof, having a second shield region of the second conduction type, a second drain region of the first conduction type, a second source region of the first conductive type, and a third channel located under said gate electrode thereof formed on the surface of said first drain layer, the third channel of said lateral MOSFET being electrically shielded from said first drain layer by said second shield region, further comprising:
   a source electrode in ohmic contact with said first base region, said first source region, said first shield region, said second shield region, and said second source region in common;
   a probe electrode in ohmic contact with said probe region; and
   a compensation resistor electrode in ohmic contact with said second drain region.

7. A power semiconductor device according to claim 6, further comprising:
   current supply means for supplying a reference current to said compensation resistor electrode; and
   operational control means for controlling said current supply means so that a signal output to said probe electrode and a voltage drop developed across said resistive channel portion have a predetermined ratio therebetween thereby increasing or decreasing said reference current; whereby
   said reference current is a current detection signal corresponding to a current flowing through said power control portion.

8. A power semiconductor device according to claim 6, further comprising:
   current supply means for supplying a reference current to said compensation resistor electrode; and
   operational control means for controlling said current supply means so that a signal output to said probe electrode and a voltage drop developed across said resistive channel portion have a predetermined ratio therebetween thereby increasing or decreasing said reference current; whereby said reference current is a current detection signal corresponding to a current flowing through said power control portion.

9. A power semiconductor device according to claim 6, wherein said second shield region includes a second base region located under one end portion of said gate electrode of said lateral MOSFET and a third base region located under the other end portion of said gate electrode thereof, said second and third base regions being aligned with respect to said gate electrode thereof.

10. A power semiconductor device according to claim 9, wherein said second base region and said third base region are connected by a bridge region of the second conduction type.

11. A power semiconductor device according to claim 9, further comprising:
current supply means for supplying a reference current to said compensation resistor electrode; and
operational control means for controlling said current supply means so that a signal output to said probe electrode and a voltage drop developed across said resistive channel portion have a predetermined ratio therebetween thereby increasing or decreasing said reference current; whereby
said reference current is a current detection signal corresponding to a current flowing through said power control portion.

12. A power semiconductor device according to claim 9, wherein a fourth base region of the second conduction type is provided on the surface of said first drain layer and said second drain region is electrically connected with said compensation resistor electrode through said fourth base region.

13. A power semiconductor device according to claim 9, wherein a threshold voltage of the channel portion of said lateral transistor structure is adapted to be different from a threshold voltage of the channel portion of the unit cell of said power control portion.

14. A power semiconductor device according to claim 13, wherein, in order to make the threshold voltage of the channel portion of said lateral transistor structure different from the threshold voltage of the channel portion of the unit cell of said power control portion, a thickness of the gate insulating film of the channel portion of said lateral transistor portion is adapted to be different from a thickness of the gate insulating film of the channel portion of the unit cell of said current signal detecting portion.

15. A power semiconductor device according to claim 13, wherein, in order to make the threshold voltage of the channel portion of said lateral transistor structure different from the threshold voltage of the channel portion of the unit cell of said power control portion, impurities are diffused in the channel portion of said lateral transistor structure.

16. A power semiconductor device according to claim 9, wherein the third channel of said lateral MOSFET is pn-junction isolated from said first drain layer by an arrangement of said second base region and said third base region being put in contact so as to have a mutually overlapping region.

17. A power semiconductor device according to claim 16, wherein a fourth base region of the second conduction type is provided on the surface of said first drain layer, said fourth base region being separated from said first base region, said second base region, said third base region and said first shield region, and said second drain region being electrically connected with said compensation resistor electrode through said fourth base region.

18. A power semiconductor device according to claim 16, wherein a threshold voltage of the channel portion of said lateral transistor structure is adapted to be different from a threshold voltage of the channel portion of the unit cell of said power control portion.

19. A power semiconductor device according to claim 18, wherein, in order to make the threshold voltage of the channel portion of said lateral transistor structure different from the threshold voltage of the channel portion of the unit cell of said power control portion, impurities are diffused in the channel portion of said lateral transistor structure.

20. A power semiconductor device according to claim 19, further comprising:
current supply means for supplying a reference current to said compensation resistor electrode; and
operational control means for controlling said current supply means so that a signal output to said probe electrode and a voltage drop developed across said resistive channel portion have a predetermined ratio therebetween thereby increasing or decreasing said reference current; whereby
said reference current is a current detection signal corresponding to a current flowing through said power control portion.

21. A power semiconductor device according to claim 18, wherein, in order to make the threshold voltage of the channel portion of said lateral transistor structure different from the threshold voltage of the channel portion of the unit cell of said power control portion, a thickness of the gate insulating film of the channel portion of said lateral transistor structure is adapted to be different from a thickness of the gage insulating film of the channel portion of the unit cell of said current signal detecting portion.

22. A power semiconductor device according to claim 21, further comprising:
current supply means for supplying a reference current to said compensation resistor electrode; and
operational control means for controlling said current supply means so that a signal output to said probe electrode and a voltage drop developed across said resistive channel portion have a predetermined ratio therebetween thereby increasing or decreasing said reference current; whereby
said reference current is a current detection signal corresponding to a current flowing through said power control portion.

23. A power semiconductor device comprising;
a semiconductor substrate having a first drain layer of a first conduction type;
a power control portion having a plurality of vertical unit cells connected in parallel, each unit cell having a gate electrode formed over a surface of said first drain layer and a gate insulating film interposed therebetween and having a first base region of a second conduction type in said first drain layer, a first source region of a first conduction type in said first base region, and a first channel located under said gate electrode in said first base region;
a current signal detecting portion formed adjacent to at least a portion of said unit cells having a gate electrode formed over the surface of said first drain layer and a gate insulating film interposed therebetween and having a first shield region of the second conduction type in said first drain layer, a probe region of said first conduction type in said first shield region, and a second channel located under said gate electrode of said current signal detecting portion, said second channel adjoining said first channel of said portion, said current signal detecting portion detecting current flowing through said power control portion by detecting a voltage drop developed across a channel resistance of said first channel of said portion;

a lateral MOSFET having a gate electrode formed over the surface of said first drain layer, a gate insulating film being interposed therebetween and having a second shield region of the second conductive type in said first drain layer, a second drain region and a second source region of the first conduction type in said second shield region, and a third channel located under said gate electrode of said lateral MOSFET, both said gate electrodes of said unit cells and said lateral MOSFET being connected mutually, and said third channel being electrically shielded from said first drain layer by said second shield region and having a resistance characteristic which is approximately equal to a resistance characteristic of said first channel so as to compensate a current detection error by using said third channel as a resistor;

a source electrode contacting with said first base region, said first source region, said first shield region, said second shield region and said second source region;

a probe electrode contacting with said probe region; and a compensation resistor electrode contacting with said second drain region.

24. A power semiconductor device according to claim 9, further comprising:

current supply means for supplying a reference current to said compensation resistor electrode; and operational control means for controlling said current supply means so that a signal output to said probe electrode and a voltage drop developed across said lateral MOSFET have predetermined ratio therebetween.

* * * * *